United States Patent [19]
Nachon et al.

[11] Patent Number: 5,558,270
[45] Date of Patent: Sep. 24, 1996

[54] FINE PITCH CAPILLARY/WEDGE BONDING TOOL

[75] Inventors: Beni Nachon, Qiriat-Ata, Israel; Ehud Efrat, Horsham, Pa.; Eli Razon, Maple Glen, Pa.; Gil Perlberg, Elkins Park, Pa.

[73] Assignee: Kulicke and Soffa Investments, Inc, Wilmington, Del.

[21] Appl. No.: 369,729

[22] Filed: Jan. 6, 1995

[51] Int. Cl.$^6$ .................................. H01L 21/603
[52] U.S. Cl. ........................ 228/180.5; 228/4.5
[58] Field of Search ................ 228/110.1, 180.5, 228/1.1, 4.5, 265; 219/56.21; 156/73.2

[56] References Cited

U.S. PATENT DOCUMENTS

| | | | |
|---|---|---|---|
| 5,193,732 | 3/1993 | Interrante et al. | 228/1.1 |
| 5,421,503 | 6/1995 | Perlberg et al. | 228/4.5 |

FOREIGN PATENT DOCUMENTS

| | | | |
|---|---|---|---|
| 177736 | 8/1986 | Japan | 288/4.5 |
| 72536 | 3/1989 | Japan | 228/4.5 |
| 137342 | 5/1990 | Japan | 228/4.5 |
| 288526 | 4/1971 | Russian Federation | 228/4.5 |
| 617210 | 6/1978 | Russian Federation | 228/4.5 |

*Primary Examiner*—Samuel M. Heinrich
*Attorney, Agent, or Firm*—John B. Sowell ATT

[57] ABSTRACT

A novel high-speed capillary/wedge bonding tool is provided for use on an automatic fine wire bonder which has either a rotating bonding head or a workstation which rotates relative to the bonding head. The novel working tip of the novel bonding tool is provided with two closely spaced parallel sides having substantially zero degree cone angle when viewed from the side. The bonding tool is further provided with a substantially rectangular shaped wedge foot which extends between a segment of the chamfer diameter and a segment of the tip diameter when viewed from the front. In the preferred embodiment, the novel chamfer recess in the novel capillary/wedge bonding tool is elongated so that balls bonded at first bond are more narrow in width than in length and occupy approximately the same area as prior art high speed gold ball bonds. The novel rectangular wedge shape foot produces second mashed wedge wire bonds which are as robust as, and/or stronger than prior art mashed wedge wire bonds.

11 Claims, 2 Drawing Sheets

FINE PITCH CAPILLARY/WEDGE BONDING TOOL

RELATED APPLICATIONS

This application is related to our copending U.S. application Ser. No. 08/294,923 filed 24 Aug. 1994 for a Fine Pitch Capillary Bonding Tool.

BACKGROUND OF THE INVENTION

1. Field of the Invention

The present invention relates to high-speed bonding tools of the type used in automatic wire bonders to make fine wire interconnections between the pads on a semiconductor chip and a carrier or lead frame.

2. Description of the Prior Art

Capillary wire bonding tools are known in the prior art and are classified in International Class B23K 3/00 which corresponds to U.S. Class 219, Subclass 85D and 85F. Bonding wedges are cross-referenced with bonding capillaries and are classified in International Class B23K 1/06 as well as in U.S. Class 228, Subclasses 1 to 5.

Standard high-speed bonding capillaries were developed for use on automatic gold ball thermosonic wire bonders such as the bonder shown and described in U.S. Pat. No. 4,266,710. The working face on the tip of the bonding capillary used in such wire bonders is provided with a conical recess or inner chamfer for making a first ball bond which comprises bonding a spherical ball on the end of a fine wire. The working face of the tip of the prior art bonding capillary is usually provided with an annular ring having a face angle up to 15 degrees for making the second or wedge bond which comprises mashing, bonding and severing the fine interconnecting wire on the second bond target. The annular ring working face on such standard capillaries permitted the bonding tool to move from a first bond position in any direction to a second bond position and then wedge bond the fine wire to a lead frame or carrier at second bond.

In contrast thereto, automatic thermosonic wedge bonders such as the bonder shown in U.S. Pat. No. 4,239,144 were provided with a rotary heads which permitted rotational alignment of the working face of the wedge bonding tool along a directional axis between the first and the second bond target. The rotary head feature permitted the tip of the working face of the bonding wedge bonding tool to be made more narrow than conventional capillary bonding tools. Because of the ability of the rotary bonding head wedge bonding machine to employ narrow face wedges, it was generally assumed that rotary head automatic wedge bonding machines have the ability to make fine wire interconnections on closer pitch spacings than bonding machines which employed ball bonding capillaries having an annular ring working face for making the second bond. One of the reasons that wedge bonding tools are capable of making first bonds on finer and closer pitch centers than the capillary ball bonding tools is that the wedge bonding tool does not create a mashed ball at the first bond, but instead makes a mashed wire bond substantially identical to a second wedge bond. Such mashed wire bonds have less shear strength than a first ball bond. Heretofore, wedge wire bonds made at first bond did not provide bonds as consistently strong in tension as ball bonds.

The continuing miniaturization of semiconductor chips is driving the pad size toward 3.3 mils squares placed on 3.8 mils centers. The recommended ball size for 1 mil gold wire is about 2.4 mils which when mashed and bonded at first bond becomes about 3.5 mils or 3.5 times the wire diameter for 1 mil wire. For prior art ball bonders, the pad size is limited by the mashed and bonded ball size which also limits the pitch between the centers of the pads.

It would be desirable to provide a capillary or wedge bonding tool which could be used on existing type automatic wire bonders that would preserve the advantage of ball bonding capillaries and combine them with the advantages of wedge bonding tools used on rotary head automatic wedge bonding machines.

SUMMARY OF THE INVENTION

It is a principal object of the present invention to provide an improved capillary bonding tool having a novel tip shape which enables ball bonding on a very fine pitch.

It is a principal object of the present invention to provide an improved capillary/wedge bonding tool for making second bonds completely as strong and robust as those produced by the prior art capillaries.

It is a principal object of the present invention to provide an improved capillary bonding tool having a pair of narrow elongated wedge shaped working face for bonding fine wires on close pitch centers.

It is a principal object of the present invention to provide an improved wedge bonding tool for use in a rotary head automatic fine wire bonding machine.

It is a principal object of the present invention to provide a fine pitch capillary ball bonding tool which produces elongated mashed bonded balls from spherical balls.

It is a principal object of the present invention to provide a novel capillary ball bonding tool tip having closely spaced parallel sides and a working face on the tip which forms an elongated foot for wedge bonding.

It is a another principal object of the present invention to provide a novel capillary/wedge bonding tool which has a tip with a zero cone angle when viewed in one direction and has a conventional capillary tapered cone angle and face angle when viewed from an orthogonal direction.

According to these and other objects of the present invention there is provided a novel high-speed capillary/wedge bonding tool for use in a rotary head automatic fine wire bonder. The novel tip of the bonding tool is provide with two closely spaced parallel sides having substantially zero degree cone angle when viewed from the front. The bonding tool is provided with a substantially rectangular wedge shaped foot extending between a chamfer diameter and the tip diameter when viewed from the orthogonal side. A chamfer recess is provided in the bonding tool for making first mashed ball bonds and the fine wire is positioned under the wedged shape foot of the tool for making second mashed wire bonds. In a preferred embodiment, the chamfer recess is elliptically or elongated in shape and forms mashed ball bonds which are more narrow in width than in length.

DETAILED DESCRIPTION OF THE PREFERRED EMBODIMENTS

Figure 1:
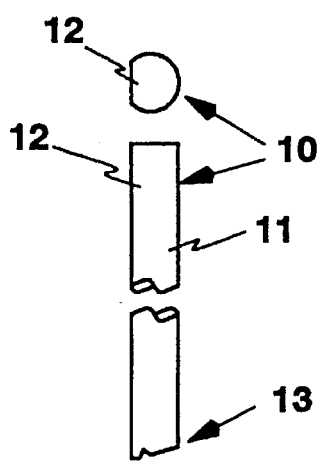
FIG. 1 is a drawing showing side elevation and plan view of a prior art wedge bonding tool.

Refer now to FIG. 1 showing a prior art wedge bonding tool 10 which has a substantially cylindrical body portion 11 adapted to be clamped into an ultrasonic transducer (not shown) and oriented therein by a flat 12. The bond tool 10 is provided with a working tip or bonding tip 13 on the lower end which is shown in enlarged cross-section in FIG. 2.

Figure 2:
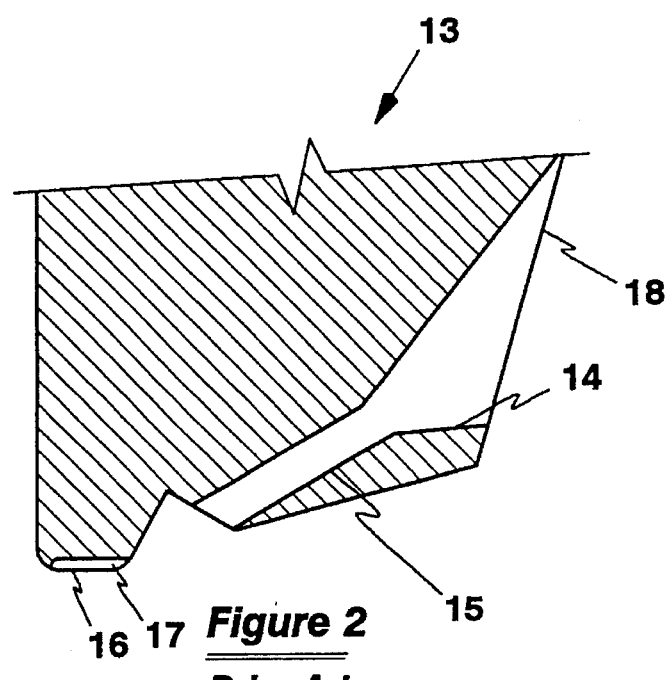
FIG. 2 is a greatly enlarged section in side elevation of the working tip of the bonding edge shown in FIG. 1.

The tip 13 of wedge bonding tool 10 shown in FIG. 2 is provided with a funnel comprising a conical wire guide 14 which connects to a wire hole 15 that directs a fine wire (not shown) under the foot 16 of the bonding tool tip 13 which has a wire groove 17 therein. The wedge bonding tool does not have a wire hole in the cylindrical body portion 11.

Figure 3:
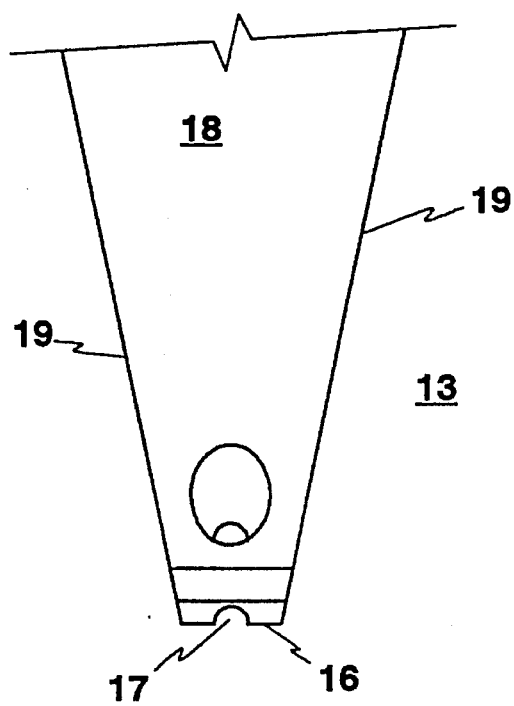
FIG. 3 is a rear elevation of the bonding wedge tip shown in FIG. 2.

Refer now to FIG. 3 showing a rear elevation of the working tip of the prior art bonding wedge 10 shown in FIGS. 1 and 2. In rear view the cone 14 appears elliptical and is enlarged when viewed on the inclined or tapered surface 18. To prepare the bonding wedge for bonding, it is necessary to feed a fine wire through the funnel and under the foot 17 which is preferably provided with some form of groove 17 which assists in holding the wire centered below the foot 16 during a bonding operation.

The preferred embodiment prior art bonding wedge tip is provided with a side taper 19 having an included angle of about 20 degrees and some form of groove or cross-groove or multiple concave or convex configuration depending on the intended purpose of use.

Figure 4:
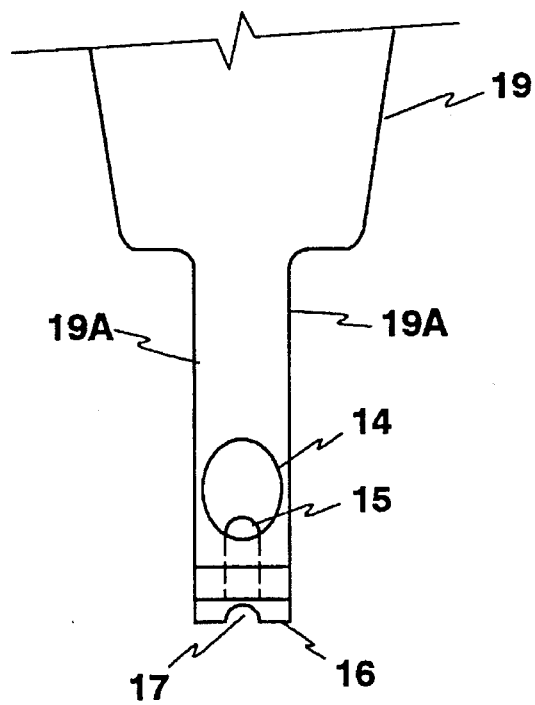
FIG. 4 is a rear elevation of a prior art bonding wedge of the type shown in FIG. 3 after undergoing side relief of the tapered sides.

Refer now to FIG. 4 showing a rear view of the tool tip 13 after undergoing side relief modification of the tapered sides 19. The sides 19A are shown parallel to each other in this modified embodiment. Such prior art wedge bonding tools were first employed to make first bonds on pads that were close to a wall or a support structure or to provide better light to and/or visual access to the bonding target. The side relief bonding wedge also provides greater side clearance between the loops of interconnecting wires of previously bonded wires on high density packages.

There are problems with prior art bonding wedges 10 of the type shown in FIGS. 1 to 4. First, the automatic wire bonder requires a rotary head that aligns the tool and groove 17 along an axis between a first and a second bond target so that the relative movement of the bonding wedge when moved from a first to a second bond will not misplace the wire from under the foot 16 and groove 17. Rotary head automatic wedge bonding machines can be used to bond gold wires and are particularly well suited from making aluminum fine wire interconnections. Heretofore, the bonded wires made by rotary head automatic wedge bonding machines were not as reliable as gold wire ball bonding machines mainly because the mashed wire bond at first bond was not as strong or reliable as a more robust ball bond made at first bond.

Figure 5:
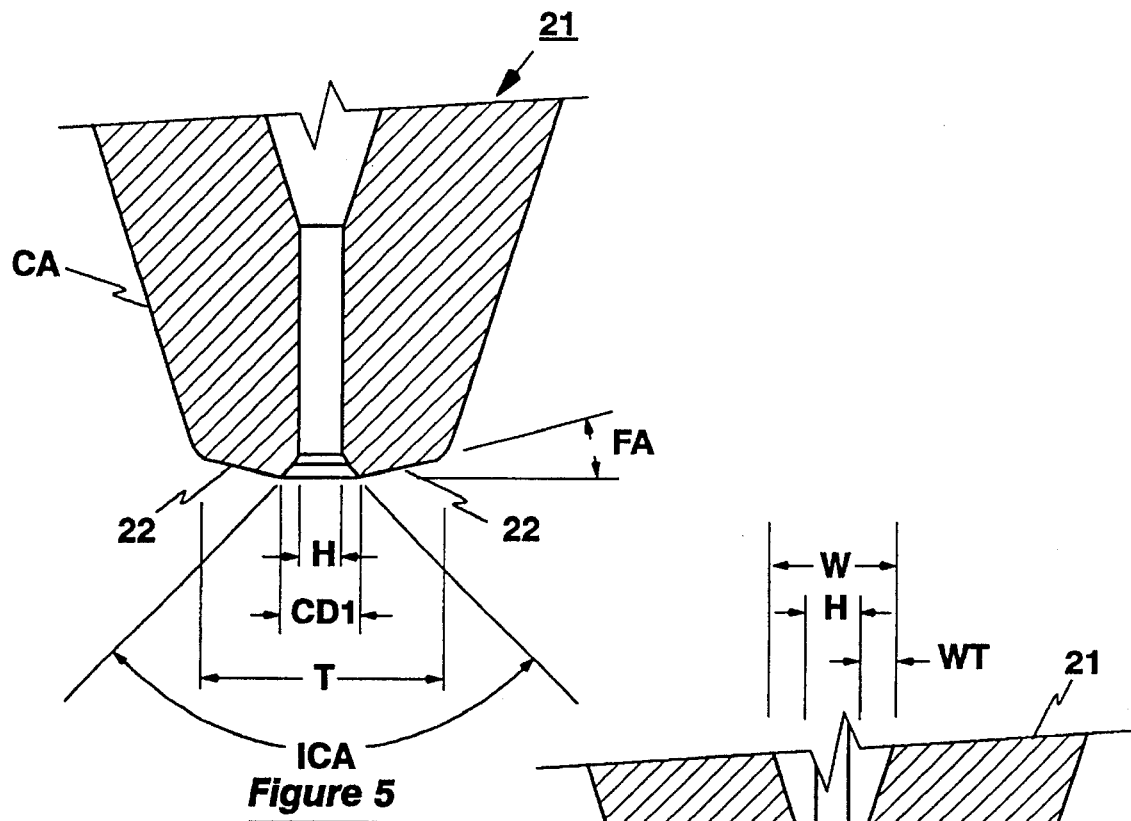
FIG. 5 is an enlarged section in side elevation of the present invention capillary/wedge bonding tool.

Refer now to FIG. 5 showing a side elevation in section of the present invention capillary/wedge bonding tool 21 having an outer profile of a high-speed capillary bonding tool such as those commercially available from the Micro-Swiss Division of Kulicke Soffa Industries Inc. in Willow Grove, Pa. As will be explained hereinafter, certain dimensions and features have been changed in the high-speed bonding tools so that the chamfer diameter (CD) is either smaller than prior art capillary bonding tools and/or the chamfer recess is shaped to form narrow elongated mashed balls having high strength. The working tip 21 of the bonding tool is shown in side elevation tapered and provided with an included cone angle (CA) in side elevation of 20 or 30 degrees. The working face (or foot 22) is provided with a face angle (FA) of preferably 4 degrees but could be modified by plus or minus 4 degrees. The hole diameter (H) for 1 mil wire is less than 1.5 mils to accommodate small balls and the tip diameter (TD) is approximately 7.0 to 8.0 mils. The small hole diameter (H) affects the chamfer diameter (CD1) which may be made less than 2.1 mils.

In side elevation the inner chamfer angle (ICA) is approximately 90 degrees at its smallest angle and is continuously increasing when elongated. When viewed from the front, the inner chamfer angle is made up 120 degrees for elongated chamfer recesses. A feature of the present invention is that each foot 22 on the working face of the tool is designed and made according to known and tried and proven dimensions used on high speed bonding capillaries. Tests have shown that the novel side relief capillary bonding tool produces second bonds that are fully equal to second bonds made with prior art high-speed bonding capillaries.

Figure 6:
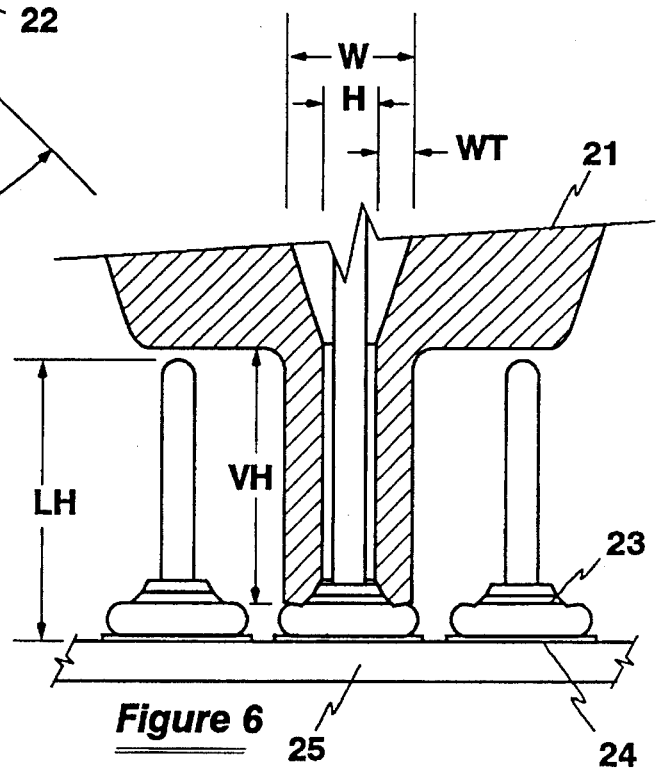
FIG. 6 is an enlarged section in front elevation of the FIG. 5 present invention capillary/wedge bonding tool.

Refer now to FIG. 6 showing the capillary bonding tool 21 shown in FIG. 5 in section and front elevation. The vertical height (VH) of the side relief is made slightly higher than the loop height (LH) of the bond shown at first bond. The cylindrical length of the hole (H) is preferably extended beyond the vertical height (VH). The mashed ball 23 is formed when the bonding tool 21 is forced down upon a spherical ball on the pads 24 of a component 25.

Tests have shown that when the tool 21 mashes a ball 23 that the ball extrudes radially out in all directions until it forms an area sufficient to resist the bonding force. Thus, when the present invention mashed ball is made more narrow in the side view and elongated in the front view, the ball is extruded into the chamfer recess and mashed out under the shape of the chamfer recess until it forms an area sufficient to overcome the bonding force. In this way, the area of an elongated ball bond bonds over an area equal to a uniform round mashed ball and produces a bond having the same strength. The resulting elongated mashed ball has the same robustness, strength and integrity of prior art balls but is more narrow and can be bonded on closer pitches.

Figure 7:
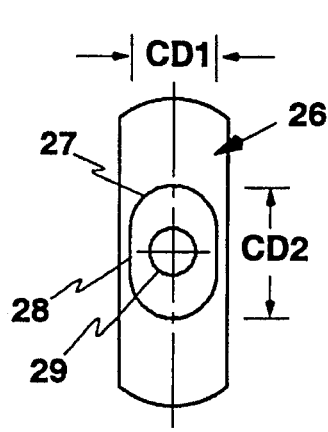
FIG. 7 is an enlarged bottom view of the capillary/wedge bonding tool shown in FIGS. 5 and 6 with a first modified chamfer recess.

Refer now to FIG. 7 showing an enlarged bottom view of a preferred embodiment capillary/wedge bonding tool of the type shown in FIGS. 5 and 6. The first modification shown in FIG. 7 has an elongated chamfer recess 26 which comprises a minor axis chamfer diameter CD1 and a major axis chamfer diameter CD2. The chamfer recess 26 is made in the form of an oval which has rounded ends 27 connected by linear sides 28 which taper directly into the wire hole 29.

The advantage of this shape chamfer recess is that it enables the manufacturer of the bonding tool to be made more easily. As long as the minor axis chamfer diameter CD1 is made as large as or slightly larger than the size of the ball and the volume of the chamfer recess 22 is properly controlled the ball will be extruded into and fill the chamfer recess and form a mashed ball having the desired area.

Figure 8:
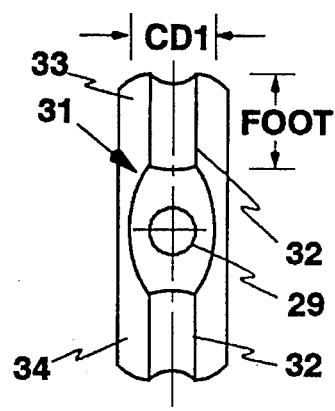
FIG. 8 is an enlarged bottom view of the capillary/wedge bonding tool shown in FIGS. 5 and 6 with a second modified chamfer recess.

Refer now to FIG. 8 showing an enlarged bottom view of the capillary/wedge bonding tool 21 shown in FIGS. 5 and 6 with a second modification chamfer recess 31. In this embodiment, the chamfer recess 31 is made in the form of a true ellipse and the sides are tapered into the hole 29. Having made the chamfer recess 31 wire grooves 32 may be added for maintaining the wire under the foot 33 or 34. The advantage of the tools shown in FIG. 8 is that the foot area 33 or 34 is easily maintained substantially the same as if the chamfer recess 31 had not been made in elongated shape. It will be appreciated that the foot area of the tools shown in FIGS. 7 and 8 have a face angle shape similar to that shown in FIG. 5 which differs from the foot area of a prior art wedge bonding tool of the type shown in FIGS. 1 to 4. Thus, the novel capillary wedge bonding tool for second bonds shown in FIGS. 5 to 9 will produce as strong a second bond as those heretofore produced with high speed prior art capillary bonding tools.

Figure 9:
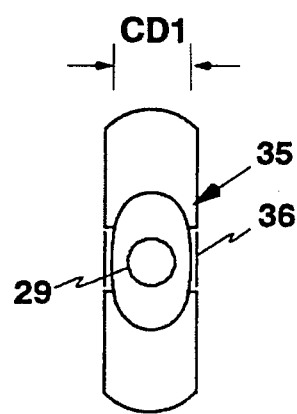
FIG. 9 is an enlarged bottom view of the capillary/wedge bonding tool shown in FIGS. 5 and 6 with a third modified chamfer recess.

Refer now to FIG. 9 showing an enlarged bottom view of the capillary/wedge bonding tool shown in FIGS. 5 and 6 with a third modified chamfer recess 35. In this embodiment the minor axis chamfer diameter CD1 is made wider so that the side walls or wall thickness (WT) as shown in FIG. 6 is so thin that it is removed by providing a recess 36 opposite the center of the wire hole 29. The advantage of this modified capillary/wedge bonding tool is that it will produce the finest possible pitch using the smallest width (W) tool that is capable of being manufactured and utilized in high-speed production. The only disadvantage of the modification shown in FIG. 9 is that a portion of the mashed ball extrudes backwards into the recess area 36 but the amount of material so extruded is so minor so as to not affect the strength of the first bond.

The major consideration in fine pitch capillary bonding tools is that the tool does not interfere with an adjacent loop and/or a mashed adjacent bond. Once the novel tool has sufficient vertical height (VH) to avoid the loop height (LH), then the only remaining consideration is the size of the mashed ball. The desirable feature of the modified tool shown in FIGS. 7 and 9 is that they eliminate or virtually eliminate any possibility that the bonding tool itself will interfer with the adjacent mashed ball bond 23.

When the chamfer diameter CD1 of the third embodiment shown in FIG. 9 is made so large as to be the same or substantially the same as the width W, the side relief 36 is desirable. In theory, when W is equal to H, the recess extends completely up the vertical height (VH) and the tool only limits the extrusion of the mashed ball in the minor axis or CD1 direction.

Having explained a preferred embodiment capillary/wedge bonding tool which will produce fine pitch ball bonds at the first bond and robust and equal strength mashed wire bonds at the second bond, it will be appreciated that other changes and modifications may be made to the tools described with reference to FIGS. 5 to 9 without departing from the present invention. Since the chamfer recess pockets of the modified embodiments shown in FIGS. 7 to 9 are not circular or conical, they cannot be polished by prior art rotational tool methods. However, the pockets may be formed in electrically conductive material by electrode discharge machining (EDM). Tools presently made from ceramic materials such as high density aluminum oxide may be impregnated with a conductive powder to enable the chamfer recess to be made with an EDM electrode having a convex shape. Further, the tools shown in FIGS. 7 to 9 may be made with rotating cutting tools by making minor modifications to the shape of the chamfer recess and moving the rotating tool relative to the working tip being machined.

What is claimed is:

1. A fine pitch capillary bonding tool for use in a rotary head automatic gold wire bonder, said bonding tool comprising:

a cylindrical shaped body portion having a wire hole through the center of the body portion, a working tip on one end of said body portion, said working tip having two distinct cone angles, a tapered working face and a tapered chamfer recess, said tapered working face having a pair of bonding wedges spaced apart from said wire hole, said bonding wedges on said working tip having a first cone angle of substantially zero degrees in a first or front direction and a tapered cone angle in a second or side direction, and said tapered chamfer recess in said working tip being tapered sufficient to constrain the radial extrusion of a ball being bonded to an object.

2. A fine pitch bonding tool as set forth in claim 1 wherein said first cone angle defines two substantially parallel walls having a vertical height (VH) which extends above the working face of said working tip for clearing the loops of bonded wires.

3. A fine pitch bonding tool as set forth in claim 2 wherein said two substantially parallel walls are separated by a tip width (W), and said wire hole in said working tip leaves two thin walls having a minimum wall thickness (WT) equal to or greater than 0.2 mils.

4. A fine pitch bonding tool as set forth in claim 1 wherein said tapered chamfer recess is elongated in shape and said tapered chamfer recess is provided with a plurality of internal cone angles.

5. A fine pitch bonding tool as set forth in claim 4 wherein said plurality of internal cone angles terminate at the tip of said working face to provide a plurality of different chamfer diameters.

6. A fine pitch bonding tool as set forth in claim 5 wherein said plurality of chamfer diameters comprises a first (CD1) and a second (CD2) chamfer diameter which define an elongated tapered chamfer recess.

7. A fine pitch bonding tool as set forth in claim 6 which further includes side wall stress relief means.

8. A fine pitch bonding tool as set forth in claim 7 wherein said stress relief means comprise recesses in said tapered working face in the parallel walls opposite the wire hole at said first chamfer diameter.

9. A fine pitch bonding tool as set forth in claim 1 wherein said tapered chamfer recess in said working tip comprises a conical and elliptical concave shape for forming and bonding round balls into elliptical ball bonds have elliptical bonded surfaces.

10. A fine pitch bonding tool as set forth in claim 1 wherein the vertical height (VH) of said two closely spaced parallel walls is equal to or less than the length of a cylindrical portion of said wire hole (H).

11. A method of making fine pitch gold wire bonds, comprising the steps of:

providing a capillary bonding tool having a wire hole through the center of the working tip, providing an elongated chamfer recess in the working tip of said bonding tool having a first chamfer diameter and a second chamfer diameter greater than said first chamfer diameter, providing a ball on a fine gold wire in said chamfer recess in said working tip having a volume at least twice the volume of said chamfer recess, and bonding said ball on said fine gold wire to a bonding target by applying a bonding force sufficient to extrude said ball into said chamfer recess and to form the ball on said gold wire into the shape of said chamfer recess so that the mashed and bonded ball is elongated in shape.

\* \* \* \* \*